United States Patent

Inoi et al.

[11] Patent Number: 6,037,706
[45] Date of Patent: Mar. 14, 2000

[54] PIEZOELECTRIC TRANSFORMER HAVING A HIGH ENERGY-CONVERSION EFFICIENCY AND HIGH RELIABILITY

[75] Inventors: Takayuki Inoi; Susumu Saito, both of Tokyo, Japan

[73] Assignee: NEC Corporation, Tokyo, Japan

[21] Appl. No.: 09/177,791

[22] Filed: Oct. 23, 1998

[30] Foreign Application Priority Data

Oct. 24, 1997 [JP] Japan ................................. 9-292597

[51] Int. Cl.[7] .................................................. H01L 41/08
[52] U.S. Cl. ......................... 310/359; 310/328; 310/366
[58] Field of Search .................................. 310/328, 358, 310/359, 366

[56] References Cited

U.S. PATENT DOCUMENTS

| 5,365,141 | 11/1994 | Kawai et al. | 310/359 |
| 5,757,106 | 5/1998 | Sato et al. | 310/359 |
| 5,892,318 | 4/1999 | Dai et al. | 310/358 |

FOREIGN PATENT DOCUMENTS

| 5-110368 | 4/1993 | Japan . | |
| 07302938A | 11/1995 | Japan | 310/359 |
| 8-69890 | 3/1996 | Japan . | |
| 8-107241 | 4/1996 | Japan . | |
| 9-83035 | 3/1997 | Japan . | |
| 9-83036 | 3/1997 | Japan . | |
| 9-275231 | 10/1997 | Japan | 310/359 |

Primary Examiner—Mark O. Budd
Attorney, Agent, or Firm—Sughrue, Mion, Zinn Macpeak & Seas, PLLC

[57] ABSTRACT

A piezoelectric transformer is described that features high energy-conversion efficiency and high reliability. Four driver piezoelectric ceramic plates are provided on the upper and lower surfaces at both ends of a generator piezoelectric ceramic plate having a rectangular shape, the driver piezoelectric ceramic plates having the same width and one-third the length of the generator piezoelectric ceramic plate. Vibration is not hindered and the energy-conversion efficiency is therefore increased in this construction because the draw-out positions of the four input electrodes and three output electrodes are all positioned at the nodes of mechanical vibration. In addition, the reliability of lead wire connections is improved because vibration places no load on the lead wires. Finally, input capacitance and step-up capabilities can be raised by adopting a multilayer construction for the driver piezoelectric ceramic plates.

8 Claims, 11 Drawing Sheets

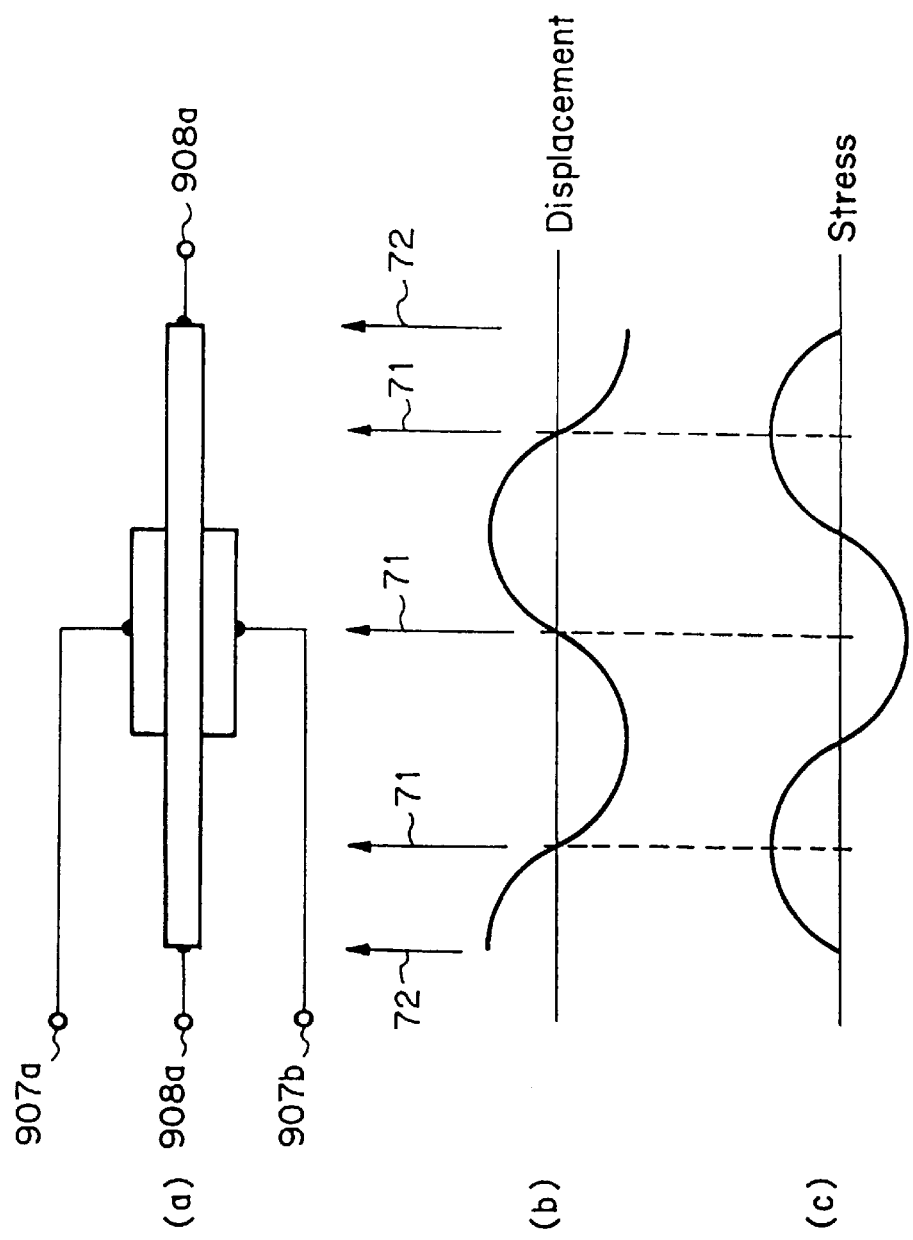

6,037,706

1

PIEZOELECTRIC TRANSFORMER HAVING A HIGH ENERGY-CONVERSION EFFICIENCY AND HIGH RELIABILITY

BACKGROUND OF THE INVENTION

1. Field of the Invention

The present invention relates to a piezoelectric transformer used in power supply circuits for illumination such as cold-cathode fluorescent tubes or in various types of power supply circuits for generating high voltage, and particularly relates to the construction of a piezoelectric transformer requiring compact size, high efficiency, a high step-up voltage, and high reliability.

2. Description of the Related Art

In the prior art, coiled electromagnetic transformers have been used as transformer elements that generate high voltage in the illumination power supplies of cold-cathode fluorescent light tubes used in liquid crystal backlights or in power supply circuits in devices that require high voltage such as television deflection devices and charging devices for copiers. Such electromagnetic transformers are of a construction in which a conductor is coiled around a magnetic core, a large number of coiled conductors being needed to realize a high transformation ratio. A compact and highly efficient electromagnetic transformer has therefore been extremely difficult to achieve.

Piezoelectric transformers that take advantage of the piezoelectric effect have been proposed to replace such electromagnetic transformers (for example, C. A. Rosen: "Ceramic Transformer" in Proceedings of the Electronic Component Symposium (1957) pp. 256–211). FIG. 1 shows a perspective view of one example of a Rosen-type piezoelectric transformer, which is a typical piezoelectric transformer. Referring to FIG. 1, this transformer is constructed such that the length of piezoelectric ceramic plate 810 having the form of a long plate is equally divided between driver 81 and generator 82. Driver 81 is polarized in the direction of thickness of piezoelectric ceramic plate 810, and electrodes 811 and 812 (not shown in the figure) are formed over the entire region of driver 81 on both the upper and lower surfaces. Generator 82 is polarized in the longitudinal direction of piezoelectric ceramic plate 810 and electrode 815 is formed on the end surfaces perpendicular to the longitudinal axis.

To boost voltage with this piezoelectric transformer, an alternating current voltage is applied from the outside across the two electrodes 811 and 812 above and below driver 81, i.e., across input-output terminal 817 and input terminal 818. Driver 81 oscillates in the longitudinal direction due to the horizontal piezoelectric effect in accordance with the above-described alternating current input voltage. A vibration is therefore generated in piezoelectric ceramic plate 810 in the longitudinal direction, and due to the vertical piezoelectric effect caused by this vibration, a stepped-up voltage of the same frequency as the input voltage is generated at generator 82 between electrode 815 at the end surface of the generator and electrode 811 or electrode 812 of driver 81 (in FIG. 1, between electrode 812 and electrode 815), i.e., between input/output terminal 817 and output terminal 819. In this case, an extremely high output voltage can be obtained if the frequency of the above-described alternating current input voltage is made the same as the mechanical resonance frequency in the longitudinal direction of piezoelectric ceramic plate 810. The piezoelectric transformer shown in FIG. 1 drives the above-described resonance in a primary mode, and therefore the length L of piezoelectric ceramic plate 810 and the wavelength λ of the alternating current input voltage are set such that L=λ/2.

In the above-described Rosen-type piezoelectric transformer of FIG. 1, the input/output voltage ratio (step-up rate) can be made larger if a high-impedance load approaching open is connected to generator 82, but a step-up rate of only several times to several tens of times can be obtained if a low-impedance load (for example, on the order of 100 kΩ) is connected. A cold-cathode fluorescent tube used as the backlight of a liquid crystal characteristically has high impedance when first turned on, but after lighting up, the impedance drops to a level of 100 kΩ. As a result, when used to light up a cold-cathode fluorescent tube, the above-described Rosen-type piezoelectric transformer obtains a sufficient step-up rate when first lighting up, but then enters a low-impedance state after initial light-up and therefore fails to obtain sufficient step-up rate, giving rise to flickering or other illumination state problems. To solve theses problems, another problem occurs which necessitates the addition of a coil transformer for preliminary step-up before the input of the piezoelectric transformer.

Piezoelectric transformers that have solved the problem of this step-up rate are disclosed in Japanese Patent Laid-open No. 83035/97 and Japanese Patent Laid-open No. 83036/97. FIG. 2a shows an exploded perspective view of the piezoelectric transformer described in Japanese Patent Laid-open No. 83035/97, and FIG. 2b is a front view showing the electrically connected and polarized states. FIG. 3a shows an exploded perspective view of the piezoelectric transformer described in Japanese Patent Laid-open No. 83036/97, and FIG. 3b is a front view showing the electrical connection and polarized states.

Explanation is first presented with reference to FIGS. 2a and 2b regarding the piezoelectric transformer disclosed in Japanese Patent Laid-open No. 83035/97. As shown in FIG. 2a, driver piezoelectric ceramic plate 902 having input electrodes 904a and 904b formed on the upper and lower surfaces, respectively, and driver piezoelectric ceramic plate 903 having input electrodes 905a and 905b formed on the upper and lower surfaces, respectively, (input electrodes 904b and 905b not shown) are bonded on opposite sides of the central portion of generator piezoelectric ceramic plate 900 having output electrodes 901a and 901b (output electrode 901b not shown) formed on the two end faces. In a piezoelectric transformer that is bonded and formed in this way, driver piezoelectric ceramic plates 902 and 903 and the central portion of generator piezoelectric ceramic plate 900 are polarized in the direction of thickness as indicated by the arrow of polarization direction 906a in FIG. 2b, and both ends of generator piezoelectric ceramic plate 900 are polarized in the direction of length as indicated by the arrows of polarization direction 906b.

After connecting input electrodes 904a and 905a to the construction polarized in this way, input terminal 907a is then connected to input electrodes 904a and 905b as shown in FIG. 2b. Then, after connecting input electrodes 904b and 905b, input terminal 907b is connected. Output electrode 901a is then connected to output terminal 908a, and output electrode 901b is connected to output terminal 908b. Application of an alternating current voltage across input terminals 907 and 907b then causes driver piezoelectric ceramic plates 902 and 903 to oscillate, and generator piezoelectric ceramic plate 900 accordingly oscillates in the direction of length due to the piezoelectric horizontal effect, thereby generating a stepped-up voltage of the same frequency as the input voltage between output terminals 908a and 908b.

When rating the step-up rate by connecting a low-impedance load of about 100 kΩ to this piezoelectric transformer of the prior art, a step-up rate of from 18–25 times is obtained when the thickness of generator piezoelectric ceramic plate 900 is 0.5–0.2 mm.

Explanation is next presented with reference to FIGS. 3a and 3b regarding the piezoelectric transformer disclosed in Japanese Patent Laid-open No. 83036/97. This piezoelectric transformer is substantially the same as the above-described piezoelectric transformer disclosed in Japanese Patent Laid-open No. 83035/97, the only differences being the connected states and polarization directions of the drivers and generator. As shown in FIG. 3a, driver piezoelectric ceramic plate 1012 having input electrodes 1014a and 1014b formed on the upper and lower surfaces and driver piezoelectric ceramic plate 1013 having input electrodes 1015a and 1015b formed on the upper and lower surfaces (input electrodes 1014b and 1015b not shown) are bonded on opposite sides of the central portion of generator piezoelectric ceramic plate 1010 having output electrodes 1011a and 1011b (output electrode 1011b not shown) formed on the two end faces. In a piezoelectric transformer that is bonded and formed in this way, driver piezoelectric ceramic plates 1012 and 1013 and the central portion of generator piezoelectric ceramic plate 1010 are polarized in the direction of thickness as indicated by the arrows of polarization direction 1016a in FIG. 3b, and both ends of generator piezoelectric ceramic plate 1010 are polarized in the direction of length as indicated by the arrows of polarization direction 1016b.

After connecting input electrodes 1014a and 1015b together, input terminal 1017a is then connected to the construction polarized in this way as shown in FIG. 3b, and input terminal 1017b is connected after input electrodes 1014b and 1015a are connected. Output electrode 1011a is then connected to output terminal 1018a, and output electrode 1011b is connected to output terminal 1018b. Application of an alternating current voltage across input terminals 1017a and 1017b then causes driver piezoelectric ceramic plates 1012 and 1013 to oscillate, and generator piezoelectric ceramic plate 1010 accordingly oscillates in the direction of length due to the piezoelectric horizontal effect, thereby generating a stepped-up voltage of the same frequency as the input voltage between output terminals 1018a and 1018b.

When rating the step-up rate by connecting a low-impedance load of about 100 kΩ to this piezoelectric transformer of the prior art, a step-up rate of from 11–20 times is obtained when the thickness of the generator piezoelectric ceramic plate is 0.5–0.2 mm.

Although the step-up rate of the piezoelectric transformer disclosed in Japanese Patent Laid-open No. 83036/97 is somewhat lower than that of the piezoelectric transformer disclosed in Japanese Patent Laid-open No. 83035/97, both obtain a higher step-up rate than the Rosen-type piezoelectric transformer of FIG. 1, and in particular, both achieve an improvement in step-up rate at a low-impedance.

The Rosen-type piezoelectric transformer and the prior-art piezoelectric transformers disclosed in Japanese Patent Laid-open No. 83035/97 and Japanese Patent Laid-open No. 83036/97 all employ vertical piezoelectric oscillation in the direction of length. Accordingly, the positions of antinodes and nodes resulting from this vertical oscillation and the positions at which the input/output electrodes are drawn out are closely connected with hindrances of oscillation, and affect the energy-conversion efficiency as well as the reliability of electrode-to-lead connections of the piezoelectric transformer.

In the piezoelectric transformers of these constructions, output electrodes 901a, 901b (1011a and 1011b) are on the end faces of generator piezoelectric ceramic plate 900 (1010), as with the Rosen-type transformer of FIG. 1. In this case, both end faces in the direction of length coincide with the antinode of mechanical resonance, and output electrodes 901a and 901b (1011a and 1011b) are formed at the positions of the antinode of this mechanical resonance. Accordingly, the points on output electrodes 901a and 901b (1011a and 1011b) that connect with output terminals 908a and 908b (1018a and 1018b) are inevitably located at antinodes of mechanical resonance in the longitudinal direction of generator piezoelectric ceramic plate 900 (1010). The antinode of vibration is located at a point having large displacement, and problems will inevitably result if a connection structure on the electrode such as solder between a lead wire and output electrodes 901a and 901b (1011a and 1011b) is at the antinode of vibration.

Specifically, the connection structure on the electrode impedes vibration of piezoelectric ceramic plate 900 (1010), leading to a decrease in transformer efficiency as well as a decrease in the step-up rate. There is the additional problem that lead wires connected at the antinodes of vibration undergo excessive vibration and break. Providing a connection point of an electrode at the antinode of mechanical resonance thus entails losses in transformer efficiency, step-up rate characteristics, and connection reliability.

The position of the output electrode at the antinode of mechanical resonance is next described with reference to FIG. 4.

FIG. 4a is a section of the prior-art piezoelectric transformer described in Japanese Patent Laid-open No. 83035/97, FIG. 4b shows the distribution of displacement of vibration, and FIG. 4c shows the distribution of stress of vibration (these figures illustrate cases of vibration in tertiary mode).

It can be seen from FIG. 4b and FIG. 4c that the end faces are at the antinodes of vibration (regardless of the vibration mode) and that nodes of vibration are located at the center and at points ⅙ the length of the ceramic plate from the end faces. Considering the relation between the positions shown herein and the positions at which electrodes are drawn out in the prior-art piezoelectric transformers (These figures take as an example the structure of the piezoelectric transformer described in Japanese Patent Laid-open No. 83035/97, but the other case is equivalent.), lead-outs from input electrodes 904a, 904b, 905a, and 905b to input terminals 907a and 907b can be positioned at the vibration nodes indicated by arrows 71. However, output terminals 908a and 908b that draw out from output electrodes 901a and 901b are positioned at the antinodes of vibration as indicated by arrows 72. Antinodes of vibration are positions of great displacement, and connecting lead wires by soldering at such positions not only impedes vibration, thereby decreasing the energy-conversion efficiency of the piezoelectric transformer, but also places a burden on the lead wires due to vibration, with the danger of line breakage.

In the constructions of the piezoelectric transformers described in Japanese Patent Laid-open No. 83035/97 and Japanese Patent Laid-open No. 83036/97, sintered monoplates are used as driver piezoelectric ceramic plates 902 and 903 (1012 and 1013), and the input capacitance is increased and the step-up rate heightened by making these sintered monoplates thin. However, these are naturally limited in varying the input capacitance and adjusting step-up rate by merely changing the thickness of a sintered monoplate. Higher step-up rates, for example, necessitate even thinner plates, but limits are imposed by the difficulties of manipulating extremely thin plates and by the effect of vibration on lead wire connections, and these factors ultimately impose an upper limit on the step-up rate.

In the constructions of the piezoelectric transformers described in Japanese Patent Laid-open No. 83035/97 and Japanese Patent Laid-open No. 83036/97, moreover, driver piezoelectric ceramic plates 902 and 903 (1012 and 1013) must be positioned and bonded in the center of generator piezoelectric ceramic plate 900 (1010). This positioning affects the vibration mode and must therefore be achieved with extreme accuracy, thereby requiring more processes for positioning during assembly and ultimately resulting in higher costs.

SUMMARY OF THE INVENTION

It is an object of the present invention to provide a piezoelectric transformer that can deliver a higher energy-conversion efficiency and higher step-up rate.

Another object of the present invention is to provide a piezoelectric transformer that does not require numerous processes during manufacturing and that has improved reliability.

To achieve the above-described objects, the piezoelectric transformer of the present invention comprises a generator piezoelectric ceramic plate having a rectangular shape. This generator piezoelectric ceramic plate is divided in the longitudinal direction into six substantially equal portions from a first to a sixth region, five band-like electrodes being formed at the five positions at the borders between these regions, and the second to the fifth regions being polarized in the longitudinal direction.

Four driver piezoelectric ceramic plates are formed, one on the upper surface of the first and second regions, one on the lower surface of the first and second regions, one on the upper surface of the fifth and sixth regions, and one on the lower surface of the fifth and sixth regions of the generator piezoelectric ceramic plate; each with an interposed insulating plate.

These four driver piezoelectric ceramic plates are substantially as wide as the generator piezoelectric ceramic plate and substantially one-third as long as the generator piezoelectric ceramic plate. In addition, an input internal electrode is formed on the surface of each driver piezoelectric ceramic plate that confronts the generator piezoelectric ceramic plate, an input electrode is formed on the surface of the opposite side, and each driver piezoelectric ceramic plate is polarized in the direction of thickness between the input electrode and input internal electrode.

The present invention is constructed such that the positions of the input electrodes and input internal electrodes, and, of the band-like electrodes, the positions of the electrodes that draw output all coincide with the position of vibration nodes.

Accordingly, the present invention increases the energy-conversion efficiency of the piezoelectric transformer because vibration is not hindered, and moreover, increases reliability by reducing the danger of line breakage due to the burden placed on lead wires by vibration.

The present invention is of a construction that can ensure ample distance on the output side and can therefore decrease output capacitance and obtain a greater step-up rate.

In the present invention, moreover, each of the driver piezoelectric ceramic plates are provided at the ends of the generator piezoelectric ceramic plate, whereby the end faces may be easily aligned with each other when bonding each of the driver piezoelectric ceramic plates to the generator piezoelectric ceramic plate.

Accordingly, the present invention allows a simplification of positioning when joining plates, a decrease in the number of required processes in fabrication, and as a result, a reduction in costs.

According to one embodiment of the present invention, the generator piezoelectric ceramic plate, each of the driver piezoelectric ceramic plates, and the insulating plates are sintered monoplates; and the generator piezoelectric ceramic plate, each of the driver piezoelectric ceramic plates, and insulating plates are joined together by an adhesive.

According to another embodiment of the present invention, the generator piezoelectric ceramic plate is made up of a multilayered body in which ceramic green sheet is multilayered, each of the driver piezoelectric ceramic plates are made up of multilayered bodies in which ceramic green sheet and input internal electrodes are alternately layered, and the generator piezoelectric ceramic plate and each of the driver piezoelectric ceramic plates are sintered together as a single unit with interposed ceramic green sheet.

Because the generator piezoelectric ceramic plate and driver piezoelectric ceramic plates are formed by means of a green tape multilayering method, the present invention simplifies the fabrication process; improves the degree of contact between the driver piezoelectric ceramic plates, insulating plates, and generator piezoelectric ceramic plate; reduces heat generation, and improves the energy-conversion efficiency.

According to another piezoelectric transformer of the present invention, each of the driver piezoelectric ceramic plates are formed by multilayering a plurality of piezoelectric ceramic plates that are polarized in the direction of thickness.

Each of the four driver piezoelectric ceramic plates is provided with a first side-surface electrode that connects every other electrode of the electrodes formed on both the upper and lower surfaces of each of the plurality of ceramic plates. Further, each of the four driver piezoelectric ceramic plates is provided with a second side-surface electrode for connecting together the plurality of electrodes formed on both the upper and lower surfaces of each of the plurality of ceramic plates that are not connected to the first side-surface electrodes.

The present invention allows an increase in input capacitance by providing the input internal electrodes with a multilayer construction, thereby allowing a higher step-up rate to be obtained.

In addition, because the input internal electrodes are of a construction in which a plurality of piezoelectric ceramic plates are multilayered, the present invention can vary the step-up rate and can increase the variations in the step-up rate by changing the number of laminated layers.

The above and other objects, features, and advantages of the present invention will become apparent from the following description with reference to the accompanying drawings which illustrate examples of the present invention.

BRIEF DESCRIPTION OF THE DRAWINGS

FIG. 4 is an explanatory view showing the positional relation of line connections and the vibration state (vibration antinodes and nodes) in the prior-art piezoelectric transformer of FIG. 2;

DETAILED DESCRIPTION OF THE PREFERRED EMBODIMENTS

First Embodiment

Figure 1:
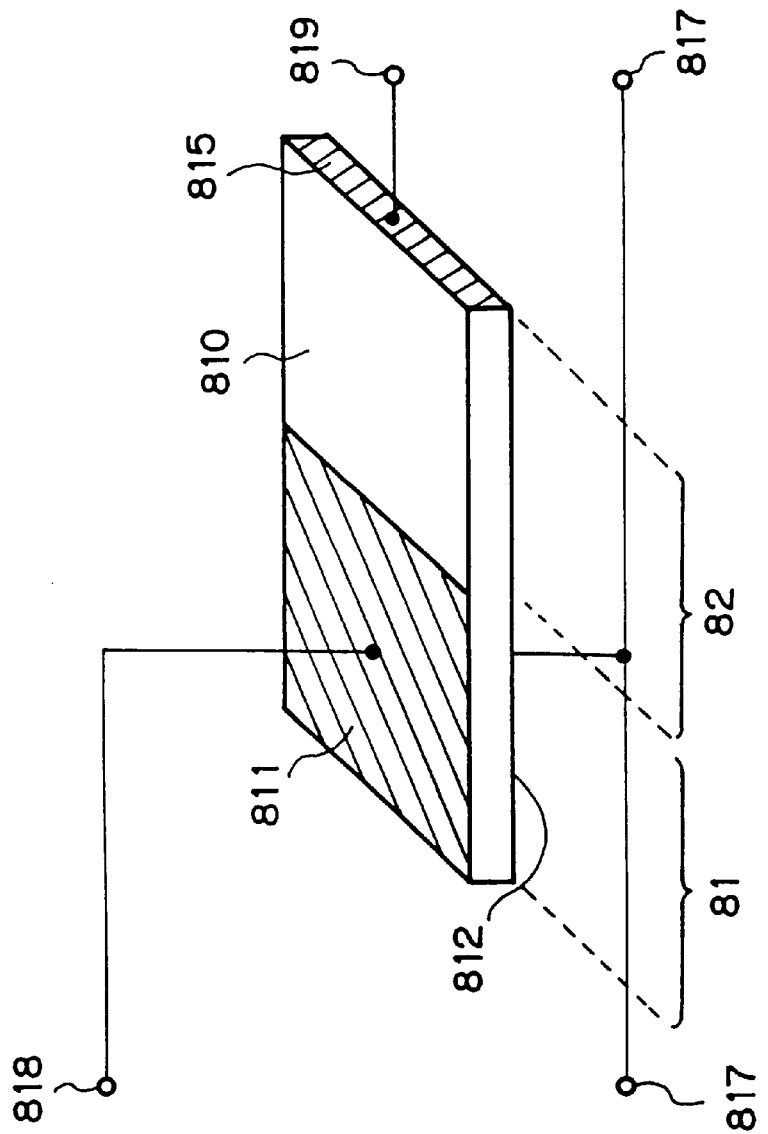
FIG. 1 is a perspective view showing a Rosen-type piezoelectric transformer of the prior art.
Figure 2A:
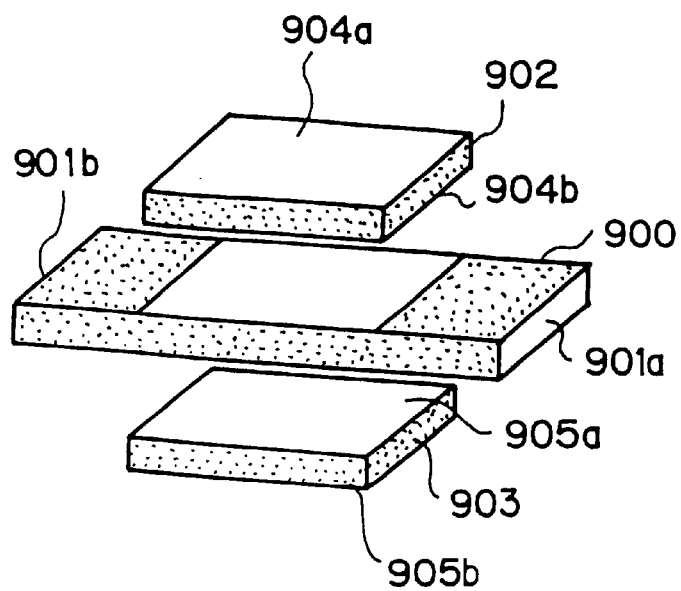
FIG. 2(*a*), 2(*b*) is a perspective view showing the construction of a piezoelectric transformer of the prior art.
Figure 2B:
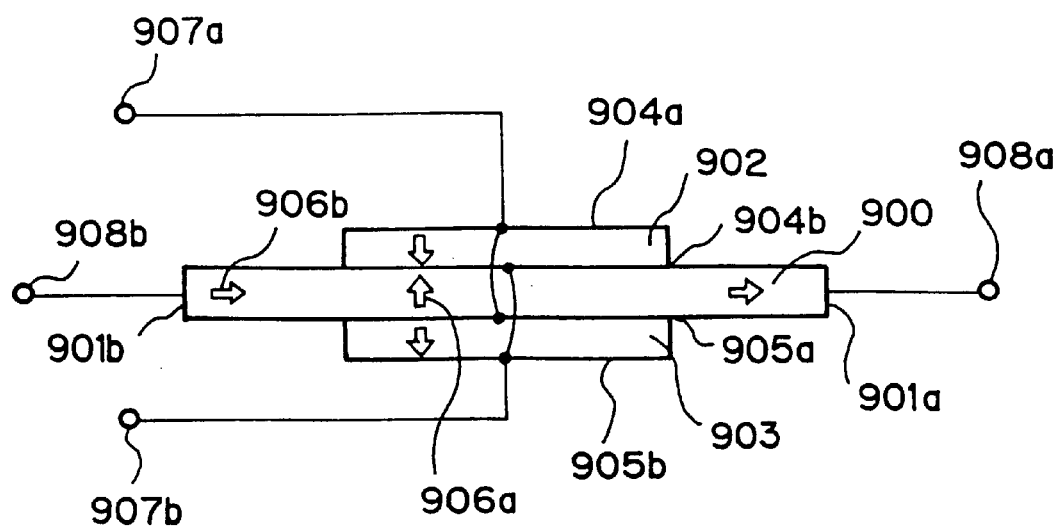
Figure 3A:
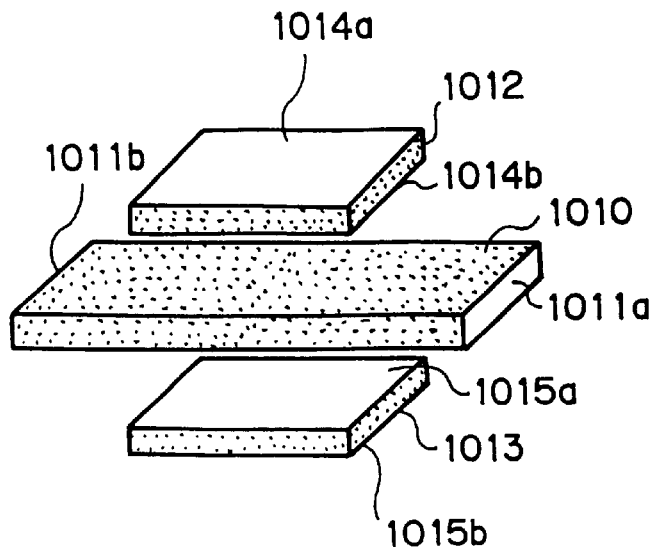
FIG. 3(*a*), 3(*b*) is a perspective view showing the construction of another piezoelectric transformer of the prior art.
Figure 3B:
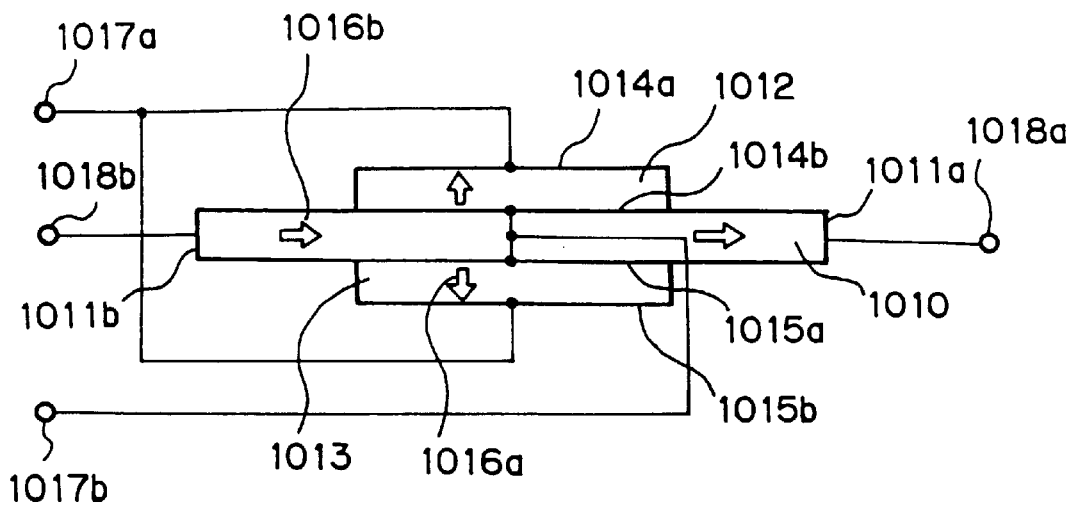
Figure 5:
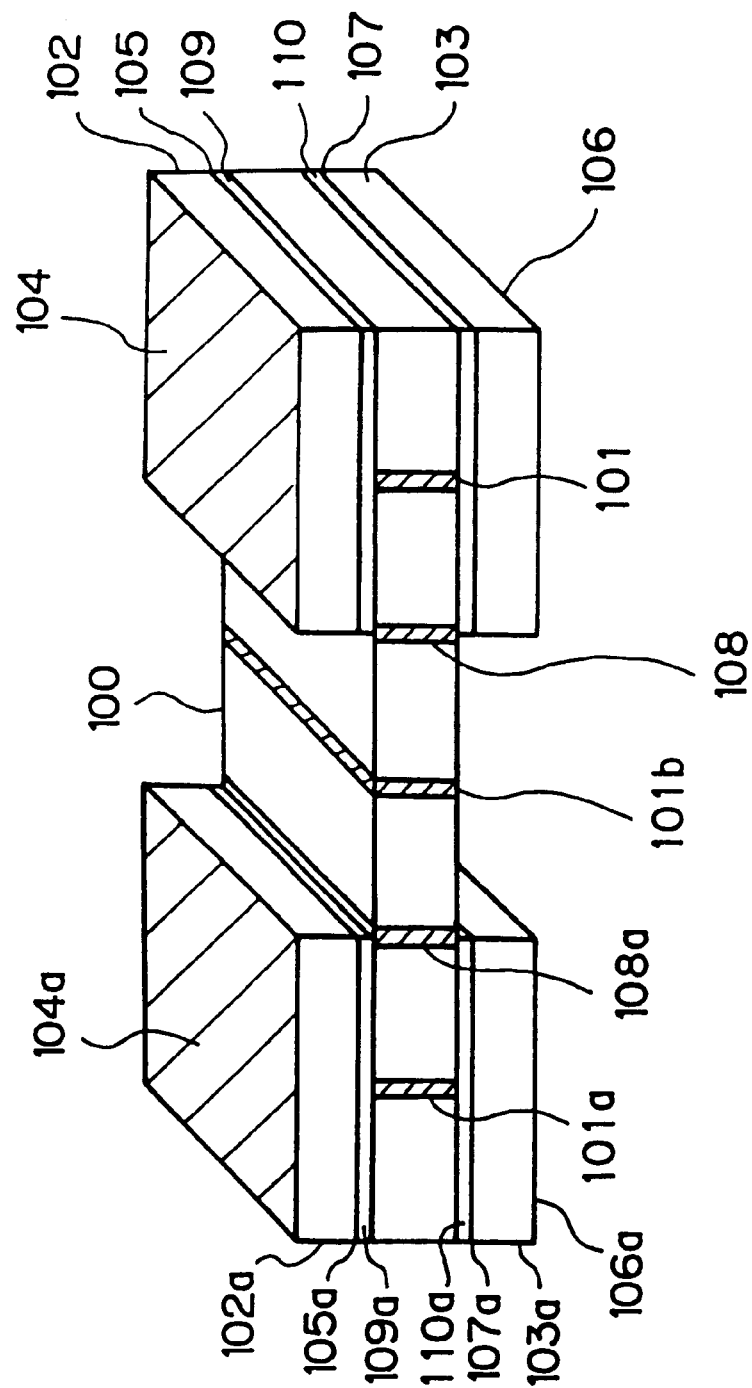
FIG. 5 is a perspective view showing the construction of a piezoelectric transformer according to the first embodiment of the present invention.
Figure 6:
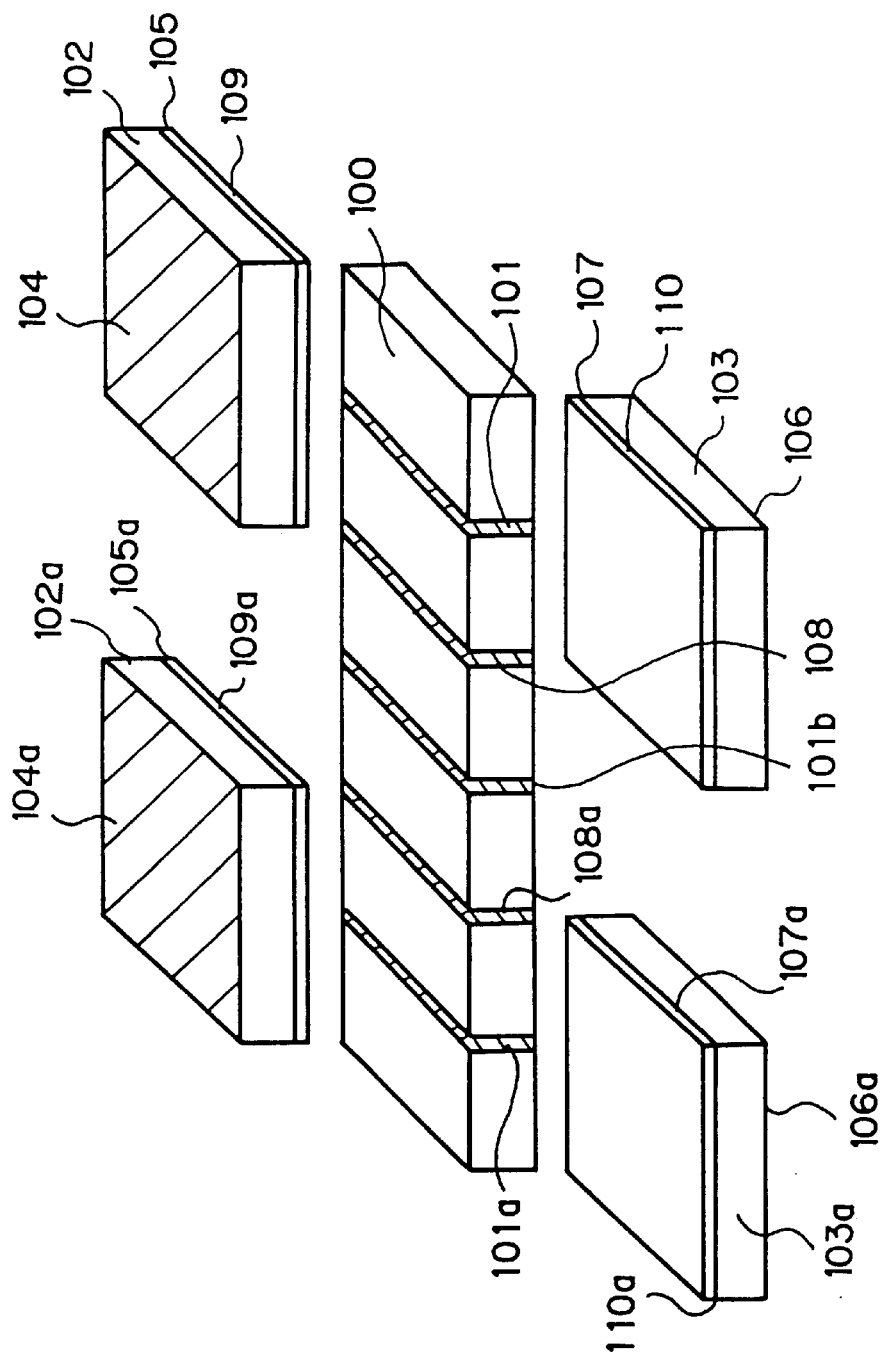
FIG. 6 is an exploded perspective view showing the construction of a piezoelectric transformer according to the first embodiment of the present invention.

As shown in FIG. 5, the piezoelectric transformer of this embodiment comprises a generator piezoelectric ceramic plate 100 of rectangular shape, and driver ceramic plates 102, 102a, 103, and 103a for being applied the input voltage to vibrate the piezoelectric transformer.

In order from the left end, output electrode 101a, polarizing electrode 108a, output electrode 101b, polarizing electrode 108, and output electrode 101 are formed as bands at positions dividing generator piezoelectric ceramic plate 100 into six equal portions in the longitudinal direction. The six regions of generator piezoelectric ceramic plate 100 that are partitioned by the five electrodes are referred to beginning from the left end, the first to sixth regions.

Driver piezoelectric ceramic plate 102 is formed on the upper surface of the fifth and sixth regions of generator piezoelectric ceramic plate 100 with interposed insulating plate 109, and driver piezoelectric ceramic plate 103 is similarly formed on the lower surface with interposed insulating plate 110. In addition, input internal electrode 105 is formed on this driver piezoelectric ceramic plate 102 on the side confronting generator piezoelectric ceramic plate 100, and input electrode 104 is formed on the opposite surface.

Similarly driver piezoelectric ceramic plate 103 has input internal electrode 107 formed on the surface confronting generator piezoelectric ceramic plate 100 and input electrode 106 formed on the opposite surface.

Insulating plate 109 is provided for isolating driver piezoelectric ceramic plate 102 and generator piezoelectric ceramic plate 100, and insulating plate 110 is provided for isolating driver piezoelectric ceramic plate 103 and generator piezoelectric ceramic plate 100.

Similarly, driver piezoelectric ceramic plates 102a and 103a are formed with interposed insulating plates 109a and 110a, respectively, on the upper surface and lower surface, respectively, of the first and second regions of generator piezoelectric ceramic plate 100. In the same way as for driver piezoelectric ceramic plates 102 and 103, input electrode 104a and input internal electrode 105a are formed on driver piezoelectric ceramic plate 102a, and input electrode 106a (not shown in the figure) and input internal electrode 107a are formed on driver piezoelectric ceramic plate 103a.

As shown in FIG. 5, driver piezoelectric ceramic plates 102, 102a, 103, and 103a have the same width as generator piezoelectric ceramic plate 100 and have one-third the length of generator piezoelectric ceramic plate 100.

The second to fifth regions of generator piezoelectric ceramic plate 100 are each polarized in the direction of length. Driver piezoelectric ceramic plates 102, 102a, 103, 103a are each polarized in the direction of thickness between input electrodes 104, 104a, 106, and 106a provided on the upper surfaces or lower surfaces and input internal electrodes 105, 105a, 107, and 107a formed on the opposing interior surfaces of driver piezoelectric ceramic plates 102, 102a, 103, 103a.

Generator piezoelectric ceramic plate 100 vibrates based on the vibration generated by driver piezoelectric ceramic plates 102, 102a, 103, 103a and generates a stepped-up voltage.

As the method of joining driver piezoelectric ceramic plates 102, 102a, 103, and 103a with generator piezoelectric ceramic plate 100 in this embodiment, driver piezoelectric ceramic plates 102, 102a, 103, and 103a are first formed using sintered monoplates in which the electrodes for input electrodes 104, 104a, 106, 106a and input internal electrodes 105, 105a, 107, 107a are already formed. Generator piezoelectric ceramic plate 100 is then formed using a sintered monoplate on which the electrodes for output electrodes 101, 101a, and 101b and polarizing electrodes 108 and 108a are already formed at prescribed positions. Driver piezoelectric ceramic plates 102, 102a, 103, and 103a are next bonded to generator piezoelectric ceramic plate 100 using an adhesive with interposed sintered monoplates that have the same shape and that are to become insulating plates 109, 109a, 110, 110a, respectively.

Figure 7:
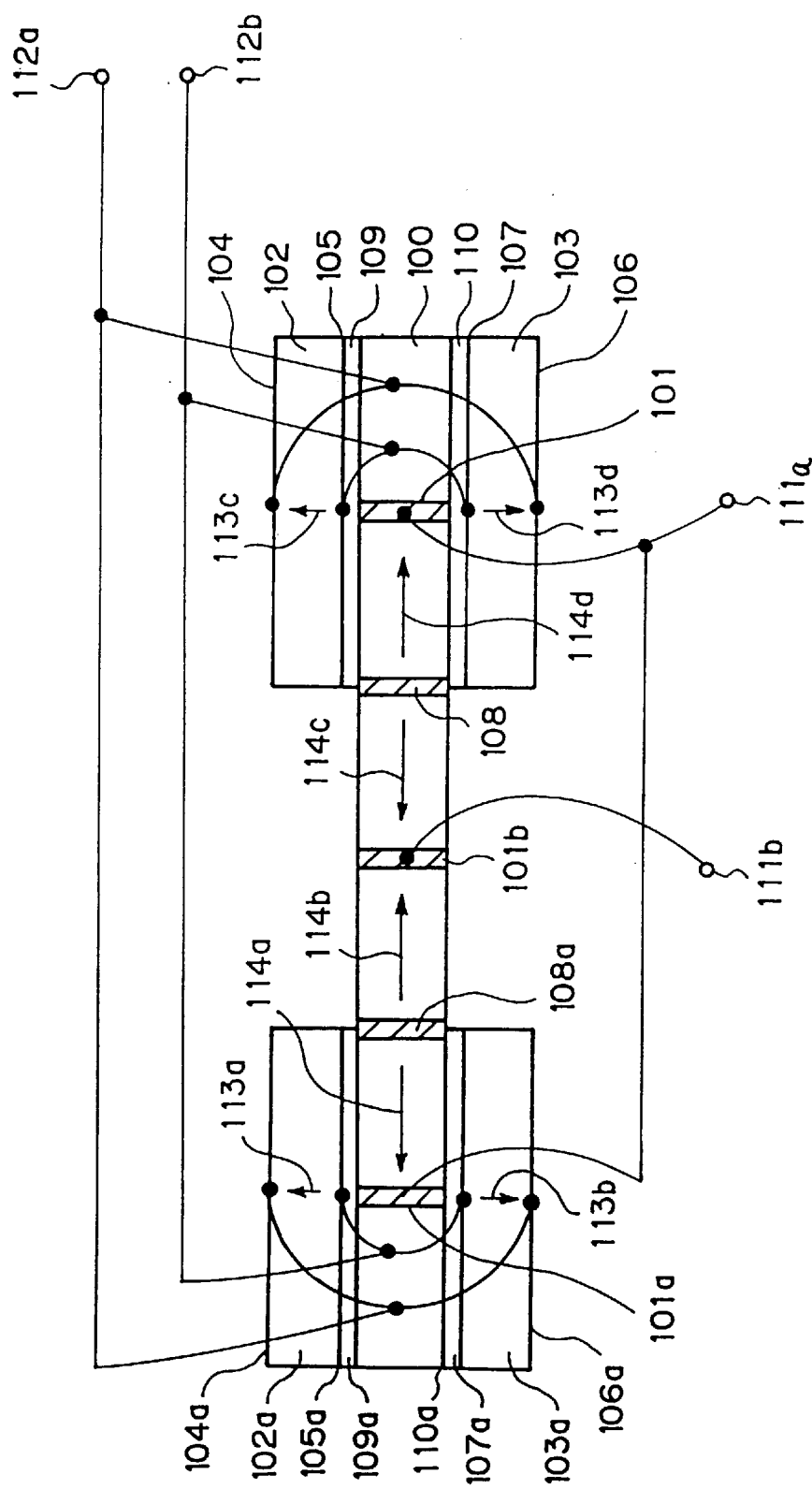
FIG. 7 is a frontal view showing the polarization directions and connection states of the piezoelectric transformer according to the first embodiment of the present invention.

FIG. 7 shows directions of polarization and connection states. Driver piezoelectric ceramic plates 102, 102a, 103, and 103a are each polarized in the directions indicated by polarization directions 113a, 113b, 113c, and 113d, respectively between input electrodes 104, 104a, 106, and 106a and input internal electrodes 105, 105a, 107, and 107a, respectively. Generator piezoelectric ceramic plate 100 is polarized in the directions indicated by polarization directions 114a, 114b, 114c, and 114d between each of output electrodes 101, 101a, and 101b and polarizing electrodes 108 and 108a.

After connecting input electrodes 104 and 106 together, these electrodes are then connected to input terminal 112a, and after connecting input electrodes 104a and 106a together, these electrodes are then connected to input terminal 112a. After connecting together input internal electrodes 105 and 107, these electrodes are then connected to input terminal 112b, and after connecting together input internal electrodes 105a and 107a, these electrodes are then connected to input terminal 112b. Finally, output electrodes 101 and 101a are both connected to output terminal 111a, and output electrode 101b is connected to output terminal 111b.

When an input voltage of a prescribed frequency is applied between input terminal 112a and input terminal 112b, a stepped-up voltage of the same frequency is generated between output terminal 111a and output terminal 111b.

Figure 8:
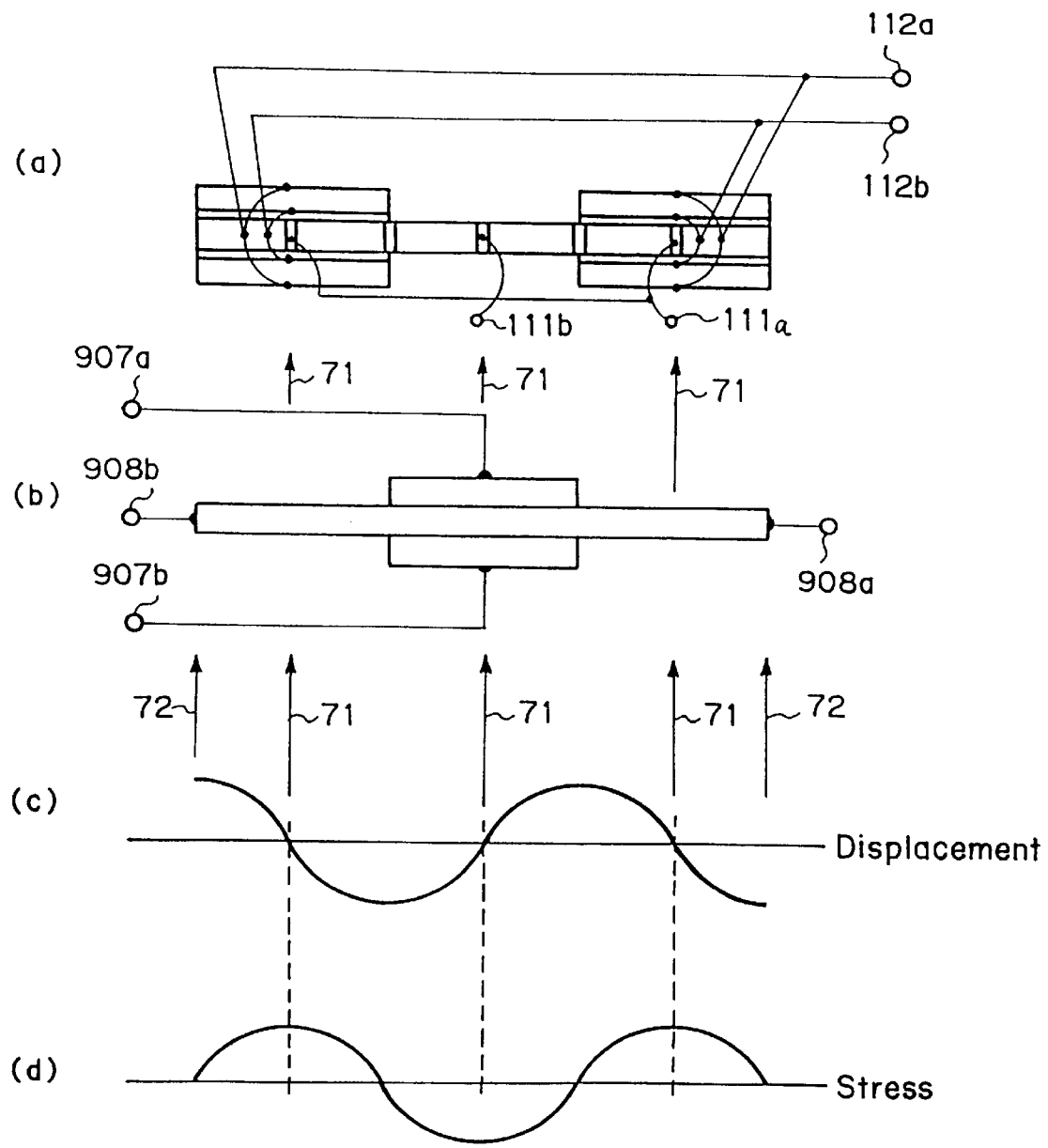
FIG. 8 is an explanatory view showing the positional relation of line connections and the vibration state (vibration antinodes and nodes) in the piezoelectric of FIG. 5.

As in the Rosen-type piezoelectric transformer and the prior-art piezoelectric transformers described in Japanese Patent Laid-open No. 83035/97 and Japanese Patent Laid-open No. 83036/97, the piezoelectric transformer of this embodiment employs a vibration perpendicular to thickness in the longitudinal direction, and the antinodes and nodes of vibration occur in accordance with this vertical vibration. The relation between these antinodes and nodes of vibration and the positions of the electrodes is next described in more detail with reference to FIG. 8. FIG. 8a is a sectional view of the piezoelectric transformer according to this embodiment, FIG. 8b shows a sectional view of the piezoelectric transformer described in Japanese Patent Laid-open No. 83035/97, FIG. 8c shows the distribution of displacement of vibration, and FIG. 8d shows the distribution of stress of vibration (these figures show a case of vibration in tertiary mode). FIG. 8b, FIG. 8c, and FIG. 8d are each the same as FIG. 4a, FIG. 4b, and FIG. 4c, respectively, and are shown together here for the purpose of explaining this embodiment.

As can be seen from FIG. 8c and FIG. 8d, the end faces are at the antinodes of vibration (regardless of the vibration mode), and the vibration nodes coincide with the center and points one-sixth the length of generator piezoelectric ceramic plate 100 from both ends. Considering the relation between the positions shown herein and the electrode lead-out positions in each of the piezoelectric transformer constructions, it can be seen that in the construction of the piezoelectric transformer of the embodiment shown in FIG. 8a, input terminals 112a and 112b and output terminals 111a and 111b that lead out from input electrodes 104, 104a, 106, and 106a, input internal electrodes 105, 105a, 107, and 107a, and output electrodes 101, 101a, and 101b are all positioned at the nodes of vibration indicated by arrows 71.

As a result, in the piezoelectric transformer of this embodiment, not only is the energy-conversion efficiency of the piezoelectric transformer higher because there is no hindrance to vibration, but the danger of line breakage is lower because there is no load placed on lead wires from vibration.

The step-up rate of a piezoelectric transformer is generally determined by the ratio (input capacitance/output capacitance), but the piezoelectric transformer of this embodiment enables a lower output capacitance, and accordingly, a greater step-up rate because a greater output side distance can be ensured than in the prior-art piezoelectric transformers shown in FIG. 2a, FIG. 2b and FIG. 3a and FIG. 3b.

In addition, when joining driver piezoelectric ceramic plates 102, 102a, 103, and 103a to generator piezoelectric ceramic plate 100, the end faces need only be aligned before bonding. The present embodiment therefore simplifies the positioning process when joining as compared with the prior-art piezoelectric transformers shown in FIG. 2 and FIG. 3, thereby allowing a reduction of fabrication processes and ultimately, a reduction in costs.

Explanation is next presented regarding a concrete example of the fabrication method of the present embodiment.

Nepec 8 (Manufactured by Tokin) was employed as the piezoelectric ceramic material in the piezoelectric transformer of this embodiment. Nepec 8 powder was first placed inside a prescribed mold, and after forming by pressure at 100 kg/cm$^2$, sintered at a peak temperature of 1100° C. and a keep time of 20 minutes to produce the sintered monoplates that become driver piezoelectric ceramic plates 102, 102a, 103, 103a, generator piezoelectric ceramic plate 100, and insulating plates 109, 109a, 110, and 110a. The sintered monoplates produced in this embodiment for driver piezoelectric ceramic plates 102, 102a, 103, and 103a were 14 mm long, 5.5 mm wide, and 0.5 mm thick. Generator piezoelectric ceramic plate 100 was 42 mm long, 5.5 mm wide, and 1 mm thick. Insulating plates 109, 109a, 110, and 110a were 14 mm long, 5.5 mm wide, and 0.2 mm thick.

Ag/Pd paste (the Ag/Pd ratio being 85/15) was coated over the entire upper and lower surfaces of driver piezoelectric ceramic plates 102, 102a, 103, and 103a, following which the plates were sintered at a peak temperature of 850° C. and a keep time of 15 minutes to form the electrodes that were to become input electrodes 104, 104a, 106, 106a and input internal electrodes 105, 105a, 107, and 107a. Ag/Pd paste (the Ag/Pd ratio being 85/15) was print-coated as a printed pattern in the form of bands onto four sides of generator piezoelectric ceramic plate 100 using a screen printing method, following which the plate was sintered at a peak temperature of 850° C. and a keep time of 15 minutes to form electrodes that were to become the band output electrodes 101, 101a, and 101b and polarizing electrodes 108 and 108a.

Next, insulating plates 109, 109a, 110, and 110a having an epoxy adhesive coated onto the upper and lower surfaces were inserted between generator piezoelectric ceramic plate 100 and each of driver piezoelectric ceramic plates 102, 102a, 103, and 103a on which electrodes were formed, following which the assembly was bonded by hardening for one hour at a temperature of 180° C. while secured in a jig.

Using a polarizing jig, an electric field of 2 kV/mm was applied to a silicone oil for an interval of 10 minutes at a temperature of 150° C. to polarize driver piezoelectric ceramic plates 102, 102a, 103, and 103a and generator piezoelectric ceramic plate 100 in the directions indicated by the arrows of polarizing directions 113a–113d and 114a–114d.

In rating the transformer characteristics of the piezoelectric transformer of this embodiment obtained as described above, a step-up rate of 25 times and an energy-conversion efficiency of 93% was obtained when voltage was applied with a resistance of 100 kΩ as load. Moreover, driver tests (on 20 units) over a period of 1000 hours showed excellent reliability and characteristics, without a single occurrence of breakage of lead wires due to vibration of the lead wires from the vibration of the piezoelectric transformer.

In contrast, lead wire breakage occurred in 10 out of 20 cases in driver tests of a Rosen-type piezoelectric transformer over the same period of time.

Second Embodiment

Explanation is next presented regarding a piezoelectric transformer according to the second embodiment of the present invention.

In contrast with the first embodiment shown in FIG. 5, generator piezoelectric ceramic plate 100 and driver piezoelectric ceramic plates 102, 102a, 103, 103a of this embodiment are formed using a green tape multilayering method.

In this embodiment, green tape in which electrodes are formed in a prescribed electrode pattern and green tape in which electrodes are not formed are multilayered to produce the structure shown in FIG. 5 and then sintered as a single unit.

A concrete example of the fabrication method of this embodiment is explained hereinbelow.

First, green tape 0.05 mm thick was prepared using Nepec 8, following which sheets of green tape were produced in which electrodes of a solid-block pattern and electrodes of a band pattern were printed using Ag/Pd paste (the Ag/Pd ratio being 70/30). Next, green tape for driver piezoelectric ceramic plates 102, 102a, 103, and 103a was cut to a length of 14 mm and a width of 5.5 mm while positioning so that the electrodes coincided with the prescribed positions. The green tape for generator piezoelectric ceramic plate 100 was then cut to a length of 42 mm and a width of 5.5 mm. Finally, green tape for inter-electrode ceramic layers and on which electrode paste was not printed was cut to prescribed sizes.

In this case, the sheets of green tape for the driver piezoelectric ceramic plates 102, 102a, 103, and 103a and insulating plates 109, 109a, 110, and 110a are 14 mm long and 5.5 mm wide. The green tape for generator piezoelectric ceramic plate 100 was 42 mm long and 5.5 mm wide.

The layers of green tape were then multilayered to form the construction shown in FIG. 5. Regarding green tape for generator piezoelectric ceramic plate 100, twenty layers of green tape on which electrodes are not printed were laminated together, and one layer of green tape on which electrode paste was been printed is laminated on both the upper and lower surfaces. Next, regarding the green tape for driver piezoelectric ceramic plates 102, 102a, 103, and 103a, ten layers of green tape on which electrode paste was not printed were laminated together between single layers of green sheet on which electrode paste was printed on the top surface in one case and the bottom surface in the other. These multilayered bodies were placed in a mold while inserting layers of green tape for insulating plates 109, 109a, 110, and 110a, and the assembly was then hot pressed at a pressure of 110 kg/cm$^2$ and a temperature of 100° C. The pressed multilayer unit was then sintered at a peak temperature of 1100° C. and a keep time of 20 minutes, following which electrode paste was printed on the side surfaces in alignment with the positions of the band electrodes of generator piezoelectric ceramic plate 100 using a Ag/Pd paste (having a Ag/Pd ratio of 85/15). The assembly is then sintered at a peak temperature of 850° C. and a keep time of 15 minutes to form input electrodes 104, 104a, 106, and 106a, input internal electrodes 105, 105a, 107, and 107a, output electrodes 101, 101a, and 101b, and polarizing electrodes 108, and 108a.

After polarizing the thus-obtained piezoelectric transformer by the same method as used in the first embodiment described hereinabove, the transformer characteristics were appraised by applying a voltage with a resistance of 100 kΩ to the transformer as load, and the same excellent results were obtained as for the first embodiment.

The piezoelectric transformer of this embodiment exhibits the same characteristics as the first embodiment described hereinabove. Considered from the viewpoint of the fabrication processes, however, the first embodiment is difficult to carry out because sintered monoplates having a thickness of 0.2 mm or 0.5 mm must be joined with an adhesive. In contrast, the green tape lamination method employed in this embodiment facilitates the process, and this embodiment is therefore superior as far as fabrication processes are concerned.

In addition, this embodiment features improved contact between driver piezoelectric ceramic plates 102, 102a, 103, and 103a, insulating plates 109, 109a, 110, and 110a, and generator piezoelectric ceramic plate 100, thereby reducing the generation of heat and accordingly improving the energy-conversion efficiency.

Third Embodiment

Explanation is next presented regarding a piezoelectric transformer according to the third embodiment of the present invention.

Figure 9:
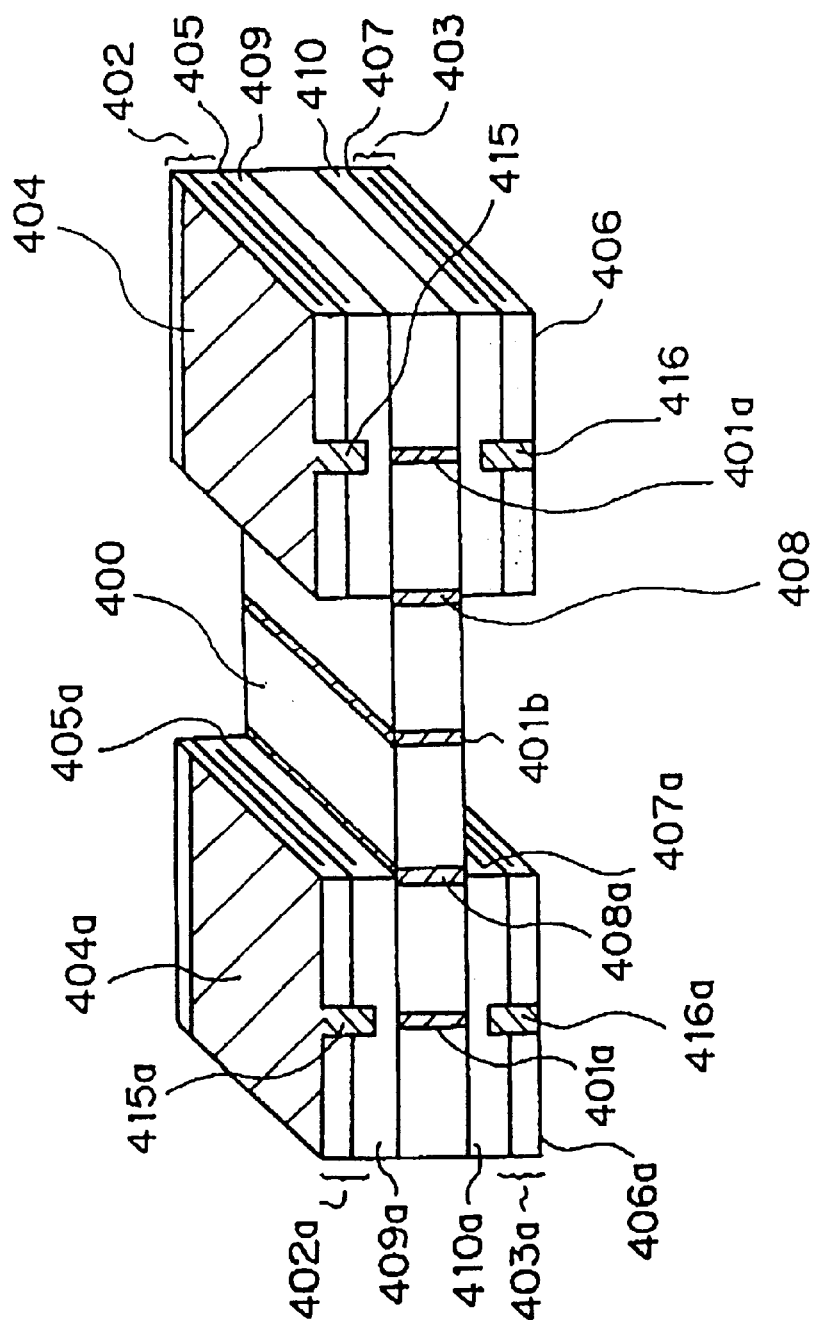
FIG. 9 is a perspective view showing the construction of a piezoelectric transformer according to the third embodiment of the present invention.
Figure 10:
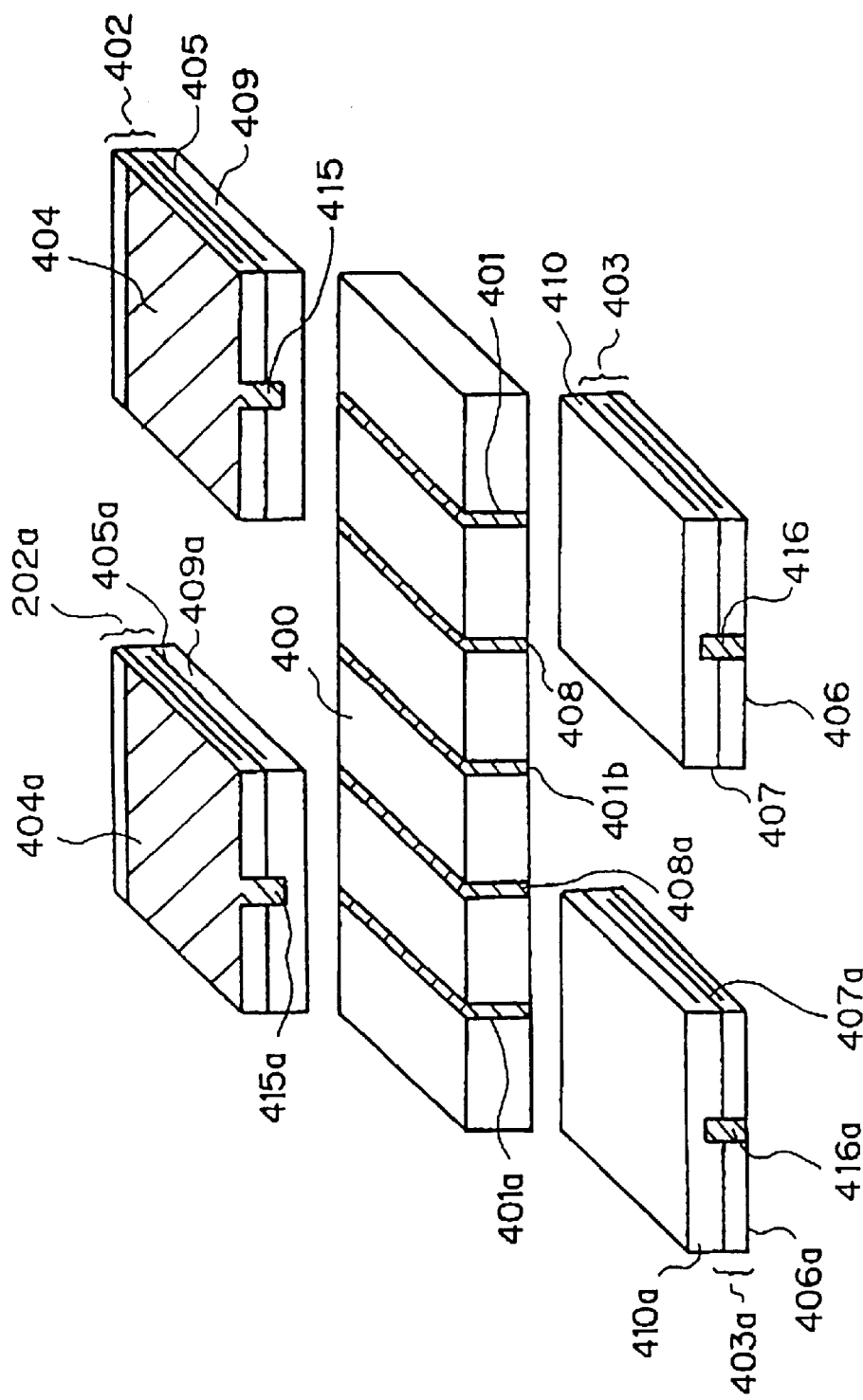
FIG. 10 is an exploded perspective view showing the construction of a piezoelectric transformer according to the third embodiment of the present invention.
Figure 11:
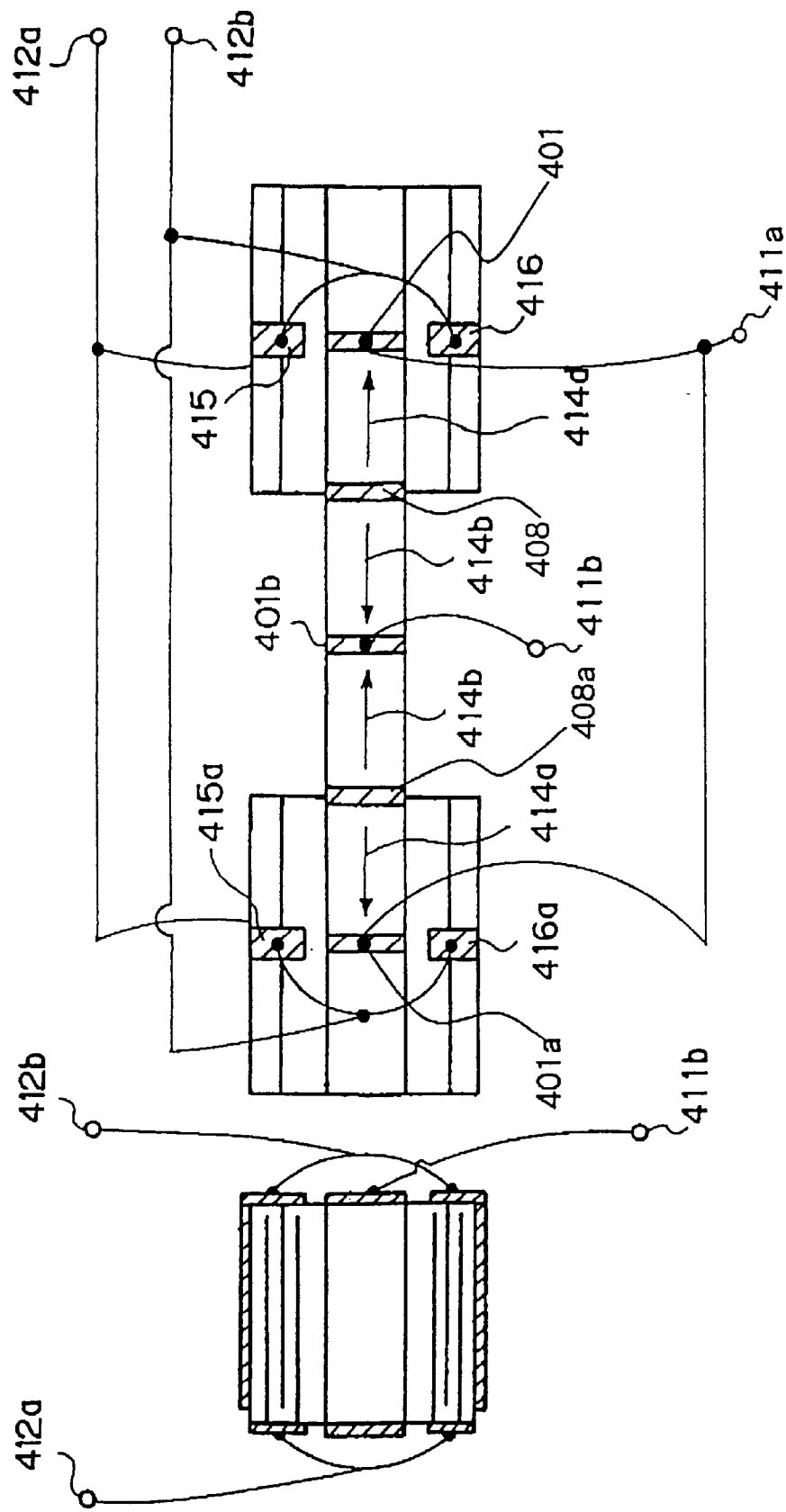
FIG. 11 is a frontal view showing the polarization direction and connection state of a piezoelectric transformer according to the third embodiment of the present invention.

FIG. 9 is a perspective view showing the construction of a piezoelectric transformer according to the third embodiment of the present invention, FIG. 10 is an exploded perspective view, and FIG. 11 is a front view showing the polarization directions and connection states.

In contrast with the above-described first embodiment, this embodiment makes driver piezoelectric ceramic plates 102, 102a, 103, and 103a as the multilayered structures driver piezoelectric ceramic plates 402, 402a, 403, and 403a. A plurality of input internal electrodes 405, 405a, 407, and 407a are formed between each of these multiple layers. Input electrodes 404, 404a, 406, and 406a are formed on the uppermost surface and on the lowermost surfaces of driver piezoelectric ceramic plates 402, 402a, 403, and 403a, as in the first embodiment.

Side-surface electrodes 415, 415a, 416, and 416a are provided for conducting electricity between every other layer between input electrodes 404, 404a, 406, and 406a and input internal electrodes 405, 405a, 407, and 407a. Although not shown in the figure, side-surface electrodes are similarly provided on the back side in the figures opposite side-surface electrodes 415, 415a, 416, and 416a, and these side-surface electrodes connect together those input internal electrodes 405, 405a, 407, and 407a which are not connected to side-surface electrodes 415, 415a, 416, and 416a that appear in the figure.

Capacitors are thus formed between each of input electrodes 404, 404a, 406, and 406a and input internal electrodes 405, 405a, 407, and 407a.

Generator piezoelectric ceramic plate 400 in the present embodiment is the same as generator piezoelectric ceramic plate 100. Output electrodes 401, 401a, and 401b and polarizing electrodes 408 and 408a are also the same as output electrodes 101, 101a, and 101b and polarizing electrodes 108 and 108a, respectively.

As shown in FIG. 11, side-surface electrodes 415, 415a, 416, and 416a are connected to input terminal 412b, and the four side-surface electrodes not shown in the figure are connected to input terminal 412a. Output electrodes 401 and 401a are connected to output terminal 411a, and output electrode 401b is connected to output terminal 411b. When an input voltage of prescribed frequency is applied across input terminal 412a and input terminal 412b, a stepped-up voltage of the same frequency is generated between output terminal 411a and output terminal 411b.

In this embodiment, driver piezoelectric ceramic plates 402, 402a, 403, and 403a are formed by forming electrodes on the upper and lower surfaces of thin sintered monoplates, and then laminating and bonding these monoplates using a conductive adhesive.

The step-up rate of a piezoelectric transformer is generally determined by the ratio of input capacitance to output capacitance, and there is a limit to input capacitance in a piezoelectric transformer in which the input internal electrodes are of a monoplate construction. The piezoelectric transformer of this embodiment, however, allows an increase in input capacitance by adopting input internal electrodes of a multilayer construction. A still greater step-up rate can therefore be obtained in this embodiment than in the first and second embodiments.

Input internal electrodes 405, 405a, 407, and 407a in this embodiment are of a construction in which a plurality of piezoelectric ceramic plates are multilayered, and the step-up rate can therefore be varied by changing the number of multilayered plates. As a result, the number of variations of step-up rates can be increased.

Explanation is next presented regarding a concrete example of the fabrication method of this embodiment.

Fabrication of generator piezoelectric ceramic plate 400 and insulating plates 409, 409a, 410, and 410a is the same as in the first embodiment, and explanation is therefore limited to driver piezoelectric ceramic plates 402, 402a, 403, and 403a. Sintered monoplates (14 mm long, 5.5 mm wide, and 0.2 mm thick) for driver piezoelectric ceramic plates 402, 402a, 403, and 403a were prepared under the same pressing and sintering conditions as in the first embodiment. Ag/Pd paste (having a Ag/Pd ratio of 85/15) was then coated onto the upper and lower surfaces of these plates in a pattern that leaves out bands along an end side, following which the plates were sintered at a peak temperature of 850° C. and a keep time of 15 minutes. Seven plates were laminated while inserting epoxy conductive adhesive between the plates, following which conductive resin was coated on the side surface to conduct electricity between input electrodes 404, 404a, 406, and 406b and input internal electrodes 405, 405a, 407, and 407a, respectively, thereby forming side-surface electrodes 415, 415a, 416, and 416a. At the same time, generator piezoelectric ceramic plate 400 and insulating plates 409, 409a, 410, and 410a were arranged as in the first embodiment with interposed epoxy adhesive, and then bonded together by hardening at 180° C. for one hour while secured in a jig.

After polarizing the thus-obtained piezoelectric transformer by the same method as in the first embodiment, the transformer characteristics were appraised by applying voltage with a resistance of 100 kΩ as load, whereby the step-up rate was found to be improved 80 times as compared with the first embodiment. In addition, the reliability of the lead wire connections were found to be equally excellent to the first embodiment.

Fourth Embodiment

In the fourth embodiment, the input internal electrodes of the driver piezoelectric ceramic plates are of a multilayer construction as in the third embodiment with the exception that the fabrication process employs a green tape multilayer method as in the second embodiment to form driver piezoelectric ceramic plates 402, 402a, 403, and 403a in the multilayer construction shown in FIG. 9, and explanation will therefore be limited to this point.

In this embodiment, seven layers of green tape 14 mm long and 5.5 mm wide after cutting are printed with electrode paste in an electrode pattern provided with uncoated areas in bands along a side that is located on a side surface and then laminated together. As for generator piezoelectric ceramic plate 400 and insulating plates 409, 409a, 410, and 410a, after forming the multilayered units as in the second embodiment, electrode paste is printed on the side surfaces using a Ag/Pd paste (having a Ag/Pd ratio of 85/15) in alignment with the band electrodes on generator piezoelectric ceramic plate 400, and electrode paste is also printed on the side surfaces of driver piezoelectric ceramic plates 402, 402a, 403, and 403a. The plates are then sintered at a peak temperature of 850° C. and a keep time of 15 minutes to form input electrodes 404, 404a, 406, and 406a, input internal electrodes 405, 405a, 407, and 407a, side-surface electrodes 415, 415a, 416, and 416a, four side-surface electrodes not shown in the figure, output electrodes 401, 401a, and 401b, and polarizing electrodes 408 and 408a.

After polarizing the thus-obtained piezoelectric transformer by the same method as in the first embodiment, the transformer characteristics are tested by applying a voltage to the transformer with a resistance of 100 kΩ as load, whereby it is found that the piezoelectric transformer of this embodiment, as with the third embodiment, exhibits a step-up rate of 80 times as compared with the first embodiment. In addition, the same excellent results as the first embodiment are found regarding the reliability of lead wire connections.

The piezoelectric transformer of this embodiment has the same characteristics as the third embodiment. When considered from the viewpoint of fabrication processes, however, the third embodiment presents difficulties regarding the joining of sintered monoplates that are just 0.2 mm thick with adhesive. The green tape multilayer method used in the second embodiment, however, simplifies this aspect of fabrication and the fourth embodiment is therefore superior in terms of fabrication processes.

In addition, this embodiment allows an improvement in contact between driver piezoelectric ceramic plates 402, 402a, 403, and 403a, insulating plates 409, 409a, 410, and 410a, and generator piezoelectric ceramic plate 400, thereby decreasing the amount of generated heat and improving the energy-conversion efficiency.

While preferred embodiments of the present invention have been described using specific terms, such description is for illustrative purposes only, and it is to be understood that changes and variations may be made without departing from the spirit or scope of the following claims.

What is claimed is:

1. A piezoelectric transformer comprising:

a generator piezoelectric ceramic plate having a rectangular shape, and divided in the longitudinal direction into six substantially equal portions from a first to a sixth region, five band-like electrodes being formed at the five positions of the borders between said regions, and said second to fifth regions being polarized in the longitudinal direction; and four driver piezoelectric ceramic plates formed substantially as wide as, and substantially one-third as long as said generator piezoelectric ceramic plate, having input internal electrodes formed on the surface confronting said generator piezoelectric ceramic plate and input electrodes formed on the surface of the side opposite said generator piezoelectric ceramic plate, and which are polarized in the direction of thickness between said input electrodes and input internal electrodes, with one driver piezoelectric ceramic plate on the upper surface of the first and second regions, one on the lower surface of the first and second regions, one on the upper surface of the fifth and sixth regions, and one on the lower surface of the fifth and sixth regions of said generator piezoelectric ceramic plate, each with an interposed insulating plate.

2. A piezoelectric transformer according to claim 1 wherein said generator piezoelectric ceramic plate is a multilayered body composed of multilayered ceramic green sheet, each of said driver piezoelectric ceramic plates are multilayered bodies in which ceramic green sheet and input internal electrodes are alternately layered, and said generator piezoelectric ceramic plate and each of said driver piezoelectric ceramic plates are sintered together as a unit with interposed ceramic green sheet.

3. A piezoelectric transformer according to claim 1 wherein said generator piezoelectric ceramic plate, each of said driver piezoelectric ceramic plates, and said insulating plates are sintered monoplates and said generator piezoelectric ceramic plate, each of said driver piezoelectric ceramic plates, and said insulating plates are joined with an adhesive.

4. A piezoelectric transformer according to claim 3 wherein said generator piezoelectric ceramic plate is a multilayered body composed of multilayered ceramic green sheet, each of said driver piezoelectric ceramic plates are multilayered bodies in which ceramic green sheet and input internal electrodes are alternately layered, and said generator piezoelectric ceramic plate and each of said driver piezoelectric ceramic plates are sintered together as a unit with interposed ceramic green sheet.

5. A piezoelectric transformer comprising:

a generator piezoelectric ceramic plate having a rectangular shape, and divided in the longitudinal direction into six substantially equal portions from a first to a sixth region, five band-like electrodes being formed at the five positions of the borders between said regions, and said second to fifth regions are polarized in the longitudinal direction; and four driver piezoelectric ceramic plates formed substantially as wide as, and substantially one-third as long as said generator piezoelectric ceramic plate, being formed by multilayering a plurality of piezoelectric ceramic plates polarized in the direction of thickness and each having electrodes formed on both the upper and lower surfaces, with one driver piezoelectric ceramic plate on the upper surface of the first and second regions, one on the lower surface of the first and second regions, one on the upper surface of the fifth and sixth regions, and one on the lower surface of the fifth and sixth regions of said generator piezoelectric ceramic plate, each with an interposed insulating plate;

four first side-surface electrodes that are provided on said each driver piezoelectric ceramic plate, for connecting together every other electrode of the electrodes formed on both the upper and lower surfaces of said plurality of ceramic plates; and four second side-surface electrodes provided on said each driver piezoelectric ceramic plates, for connecting together the electrodes formed on said plurality of ceramic plates not connected to said first side-surface electrodes.

6. A piezoelectric transformer according to claim 5 wherein said generator piezoelectric ceramic plate is a multilayered body composed of multilayered ceramic green sheet, each of said driver piezoelectric ceramic plates are multilayered bodies in which ceramic green sheet and input internal electrodes are alternately layered, and said generator piezoelectric ceramic plate and each of said driver piezoelectric ceramic plates are sintered together as a unit with interposed ceramic green sheet.

7. A piezoelectric transformer according to claim 5 wherein said generator piezoelectric ceramic plate and said insulating plates are sintered monoplates, said generator piezoelectric ceramic plate, each of said driver piezoelectric ceramic plates, and said insulating plates are joined together with an adhesive.

8. A piezoelectric transformer according to claim 7 wherein said generator piezoelectric ceramic plate is a multilayered body composed of multilayered ceramic green sheet, each of said driver piezoelectric ceramic plates are multilayered bodies in which ceramic green sheet and input internal electrodes are alternately layered, and said generator piezoelectric ceramic plate and each of said driver piezoelectric ceramic plates are sintered together as a unit with interposed ceramic green sheet.

* * * * *